United States Patent
Weis

(10) Patent No.: US 9,685,511 B2
(45) Date of Patent: Jun. 20, 2017

(54) SEMICONDUCTOR DEVICE AND METHOD FOR MANUFACTURING A SEMICONDUCTOR DEVICE

(75) Inventor: Rolf Weis, Dresden (DE)

(73) Assignee: Infineon Technologies Austria AG, Villach (AT)

(*) Notice: Subject to any disclaimer, the term of this patent is extended or adjusted under 35 U.S.C. 154(b) by 50 days.

(21) Appl. No.: 13/476,613

(22) Filed: May 21, 2012

(65) Prior Publication Data

US 2013/0307059 A1 Nov. 21, 2013

(51) Int. Cl.
*H01L 29/78* (2006.01)
*H01L 21/336* (2006.01)
*H01L 29/10* (2006.01)
*H01L 29/66* (2006.01)
*H01L 29/06* (2006.01)
*H01L 29/423* (2006.01)

(52) U.S. Cl.
CPC ...... *H01L 29/1095* (2013.01); *H01L 29/0634* (2013.01); *H01L 29/66734* (2013.01); *H01L 29/7813* (2013.01); *H01L 29/0653* (2013.01); *H01L 29/0696* (2013.01); *H01L 29/42368* (2013.01)

(58) Field of Classification Search
CPC ... H01L 29/78; H01L 29/06; H01L 29/66734; H01L 29/0634; H01L 29/7802
USPC .................................................. 257/330–333
See application file for complete search history.

(56) References Cited

U.S. PATENT DOCUMENTS

| | | | |
|---|---|---|---|
| 6,103,578 A | 8/2000 | Uenishi et al. | |
| 6,410,958 B1 | 6/2002 | Usui et al. | |
| 6,803,626 B2 | 10/2004 | Sapp et al. | |
| 7,482,220 B2* | 1/2009 | Loechelt | H01L 21/761 257/328 |
| 2005/0116267 A1 | 6/2005 | Zundel et al. | |

(Continued)

FOREIGN PATENT DOCUMENTS

| | | |
|---|---|---|
| DE | 102007036147 A1 | 3/2009 |
| WO | 0247171 A1 | 6/2002 |

OTHER PUBLICATIONS

P. Moens, et al. "UltiMOS: A Local Charge-Balanced Trench-Based 600V Super-Junction Device." Proceedings of the 23rd International Symposium on Power Semiconductor Devices & IC's. May 23-26, 2011. pp. 304-307. IEEE, San Diego.

*Primary Examiner* — Marc Armand
*Assistant Examiner* — Quinton Brasfield
(74) *Attorney, Agent, or Firm* — Murphy, Bilak & Homiller, PLLC

(57) ABSTRACT

A semiconductor device includes a first region of a first conductivity type and a body region of a second conductivity type, the first conductivity type being different from the second conductivity type. The body region is disposed on a side of a first surface of the semiconductor substrate. The semiconductor device further includes a plurality of trenches arranged in the first surface of the substrate, the trenches extending in a first direction having a component perpendicular to the first surface. Doped portions of the second conductivity type are adjacent to a lower portion of a sidewall of the trenches. The doped portions are electrically coupled to the body region via contact regions. The semiconductor device further includes a gate electrode disposed in an upper portion of the trenches.

11 Claims, 15 Drawing Sheets

(56) References Cited

U.S. PATENT DOCUMENTS

| | | | |
|---|---|---|---|
| 2006/0267088 A1* | 11/2006 | Sharp | H01L 29/66734 257/341 |
| 2009/0057713 A1* | 3/2009 | Hirler | H01L 29/1095 257/143 |
| 2009/0072301 A1* | 3/2009 | Bhalla et al. | 257/328 |
| 2010/0052047 A1 | 3/2010 | Schmidt | |
| 2010/0314682 A1* | 12/2010 | Yilmaz | H01L 29/0661 257/328 |
| 2011/0147843 A1 | 6/2011 | Wood et al. | |
| 2012/0083083 A1* | 4/2012 | Hshieh | H01L 29/1095 438/270 |
| 2013/0200451 A1* | 8/2013 | Yilmaz | H01L 29/4236 257/331 |

\* cited by examiner

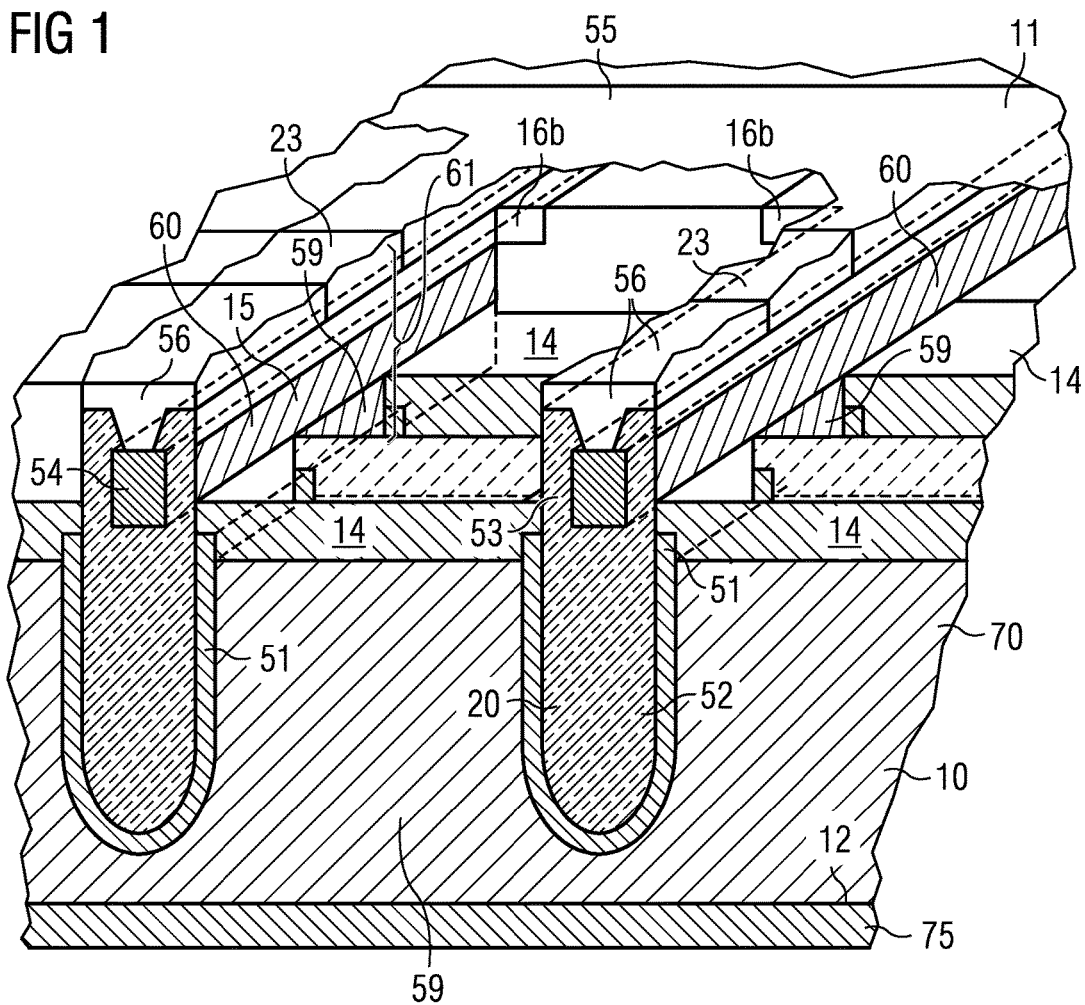

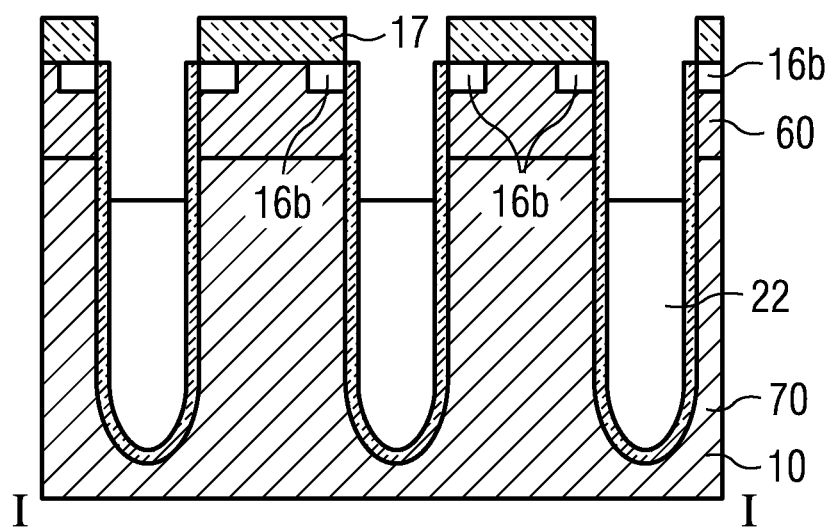
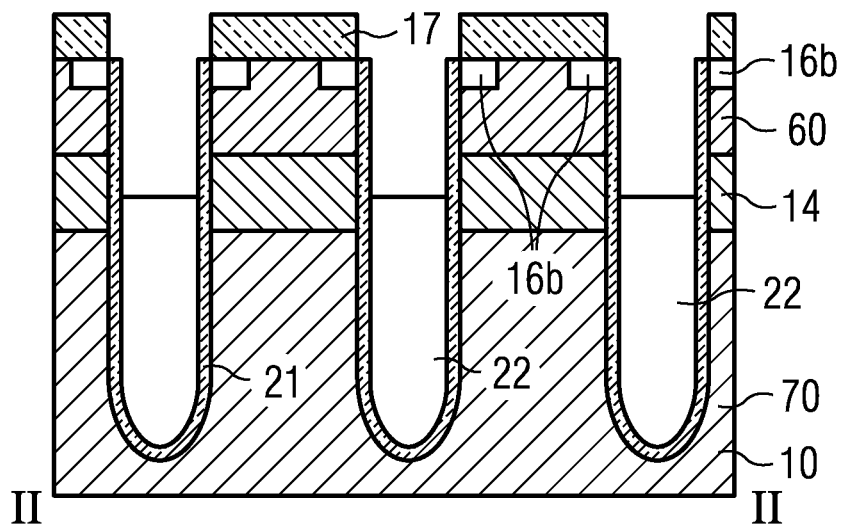

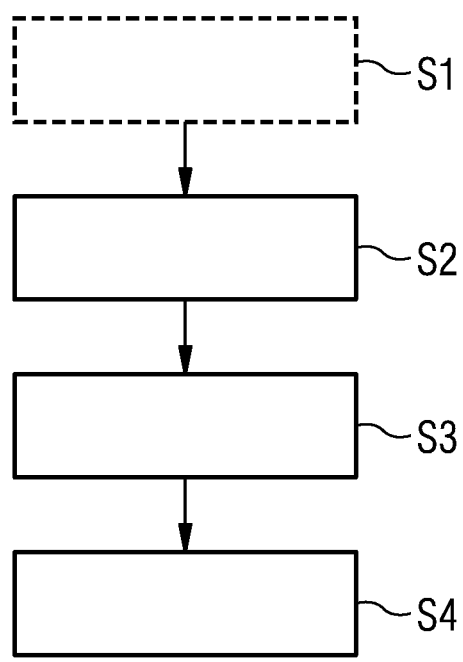

SEMICONDUCTOR DEVICE AND METHOD FOR MANUFACTURING A SEMICONDUCTOR DEVICE

TECHNICAL FIELD

The present disclosure relates to a semiconductor device and a method of manufacturing a semiconductor device.

BACKGROUND

Power MOSFETs (metal oxide semiconductor field effect transistor) are examples of high breakdown voltage semiconductor devices which are used for switching power sources, inverter devices or the like. For example, these MOSFETs are configured to switch high voltages at low-ohmic loads so as to have a very small switching and conduction loss and thus requiring a small on resistance ($R_{on}$) and a high breakdown voltage when being switched off. For example, a power MOSFET should withstand a drain to source voltage VDS of some tens to some hundreds Volts when being switched off. As a further example, power MOSFETs conduct a very large current which may be up to some hundreds of Amperes at a gate-source voltage of about 10 to 20 V at a low voltage drop VDS.

In order to meet the increasing demands on small $R_{on}$ and high breakdown voltage, it is desirable to develop new concepts of a semiconductor device, e.g. a vertical semiconductor device.

SUMMARY

According to an embodiment of a semiconductor device, the semiconductor device includes a semiconductor substrate comprising a first region of a first conductivity type and a body region of a second conductivity type, the first conductivity type being different from the second conductivity type. The body region is disposed on a side of a first surface of the semiconductor substrate. The semiconductor device further includes a plurality of trenches arranged in the first surface of the substrate, the trenches extending in a first direction having a component perpendicular to the first surface. Doped portions of the second conductivity type are adjacent to a lower portion of a sidewall of the trenches. The doped portions are electrically coupled to the body region via contact regions. The semiconductor device further includes a gate electrode disposed in an upper portion of the trenches.

According to an embodiment of a method of manufacturing a semiconductor device, the method includes forming a plurality of trenches in a first surface of a semiconductor substrate. The semiconductor substrate includes a first region of a first conductivity type and a body region of a second conductivity type, the first conductivity type being different from the second conductivity type. The trenches are formed so as to extend in a first direction having a component perpendicular to the first surface. The method further includes forming doped portions of the second conductivity type adjacent to a lower portion of a sidewall of the trenches. The method further includes electrically coupling the doped portions to the body region via contact regions. The method further includes forming a gate electrode in an upper portion of the trenches.

According to an embodiment of a superjunction semiconductor device, the superjunction semiconductor device includes a charge compensation zone. The superjunction semiconductor device further includes a semiconductor substrate including a first surface and a second surface, a source region adjacent to the first surface and a drain region adjacent to the second surface. The superjunction semiconductor device further includes trenches in the first surface of the semiconductor substrate. The superjunction semiconductor device further includes a drift zone between the source region and the drain region. The superjunction semiconductor device further includes a doped portion adjacent to a lower portion of the trenches. The doped portion and a part of the drift zone adjoining the doped portion are part of the charge compensation zone. The superjunction semiconductor device further includes a gate electrode disposed in the trenches.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1 shows a perspective view of a vertical semiconductor device circuit according to an embodiment;

FIGS. 3 to 13 illustrate steps for forming a vertical semiconductor device; and

FIG. 14 shows a diagram illustrating one embodiment of a method of manufacturing a semiconductor device.

DETAILED DESCRIPTION

Figure 2A:
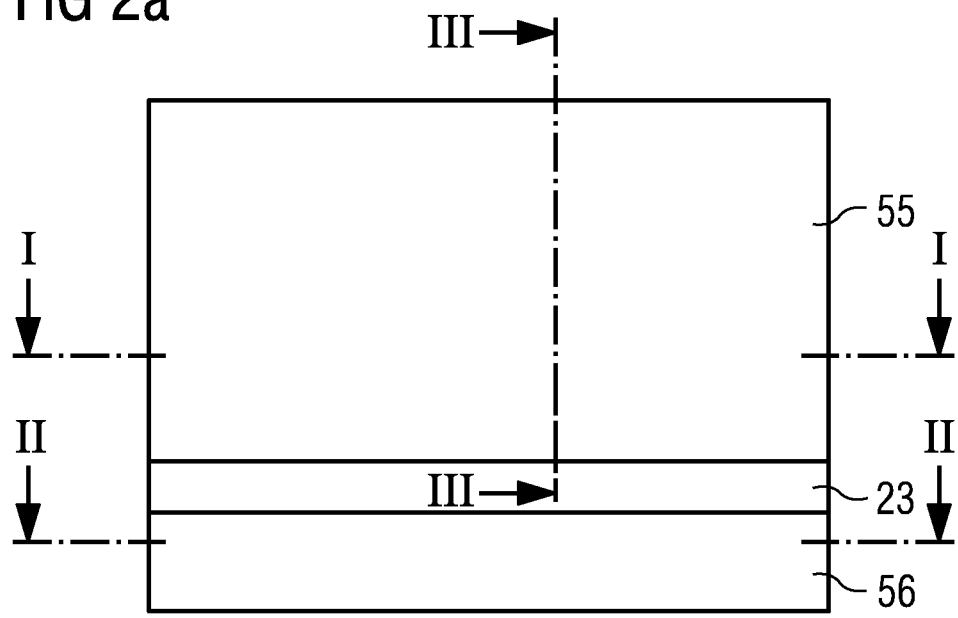
FIG. 2 shows various views of a vertical semiconductor device according to an embodiment.

In the following detailed description reference is made to the accompanying drawings, which form a part hereof and in which is illustrated by way of illustration specific embodiments in which the invention may be practiced. In this regard, directional terminology such as "top", "bottom", "front", "back", "leading", "trailing", etc., is used with reference to the orientation of the Figures being described. Since components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The terms "substrate" or "semiconductor substrate" used in the following description may include any semiconductor-based structure that has as semiconductor surface. Substrate and structure are to be understood to include silicon, silicon on insulator (SOI), silicon on sapphire (SOS), doped and undoped semiconductors, epitaxial layers of silicon supported by a base semiconductor foundation, and other semiconductor structures. For example, the "substrate" or "semiconductor substrate" may be a monocrystalline material. The semiconductor need not be silicon-based. The semiconductor could as well be silicon carbide, silicon-germanium, germanium, germanium or gallium arsenide.

In the present disclosure, doped portions such as doped portions of a first or a second conductivity type are referred to. As is clearly to be understood, the terms "first" and "second" conductivity type may refer to n or p doped semiconductor portions or vice versa. These portions may be formed by generally known doping methods using dopants such as As, P, S, Sb as an n dopant for silicon material. Examples for a p dopant for silicon material comprise B, Al or In.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1 shows a perspective view of a vertical semiconductor device. The vertical semiconductor device may be a discrete semiconductor or part of an integrated circuit. As is shown in FIG. 1, the vertical semiconductor device includes a semiconductor substrate 10 comprising a first region 70 of a first conductivity type and a body region 60 of a second conductivity type, the first conductivity type being different from the second conductivity type. The body region 60 is disposed on a side of a first surface 11, e.g. a front surface of the semiconductor substrate 10. The vertical semiconductor device further comprises a plurality of trenches 20 arranged in the first surface 11 of the substrate 10, doped portions 51 of a second conductivity type adjacent to a lower portion of the sidewall of the trenches 20. The doped portions 51 are electrically coupled to the body region 60 via contact regions 14. The vertical semiconductor device further includes a gate electrode 54 disposed in an upper portion of the trenches 20.

In the context of the present application, the term "upper portion of the trench" relates to a portion in which the doped body region 60 is disposed. The term "lower portion of the trench" corresponds to a portion adjacent to the trench bottom. For example, the lower portion of the trench 20 may be disposed below a bottom side of the body region 60. For example, the first region 70 of the semiconductor substrate 10 may be n-doped and the doped portions 51 adjacent to the trench sidewall may be p-doped.

The trenches 20 extend in a first direction having a component perpendicular to the first surface 11 of the substrate 10. The first direction may extend in the depth direction with respect to the first or front surface 11 of the semiconductor substrate 10. For example, the trenches 20 may extend perpendicularly with respect to the first or front surface 11 of the semiconductor substrate 10. The trenches 20 may be arranged so as to extend in a second direction parallel to the first surface 11 of the semiconductor substrate 10. The doped portions 51 of the second conductivity type may line the sidewall and a bottom side of each of the trenches 20. Differently stated, these doped portions may be formed conformally with the lower trench portion. For example, the vertical semiconductor device may be a superjunction device including a charge compensation zone which is formed of the doped portions 51 at opposing sidewalls of adjacent trenches 20 and a part of the drift zone 59 between adjacent trenches 20. The drift zone 59 is formed in a first region 70 having the first conductivity type.

Source regions 16b may be disposed adjacent to the first surface 11 of the substrate 10. Further, the body region 60 of the second conductivity type is disposed adjacent to the gate electrode 54, the gate electrode 54 being insulated from the body region 60 by a gate insulating material 53. Portions of the body region 60 having the second conductivity type are disposed adjacent to the drift zone 59 having the first conductivity type. A channel region 15 of a transistor 61 is disposed in the body region 60. The channel region 15 is disposed adjacent to the gate electrode 54, the gate electrode 54 being insulated from the channel region 15 by the gate insulating material 53.

The contact regions 14 may be doped with the second conductivity type and may be electrically coupled with the body region 60.

As will be shown below in FIG. 2, the contact regions 14 may be disposed at a distance from the first surface 11 of the substrate and the contact regions 14 of the second conductivity type may be arranged alternating with portions of the drift zone 59 being doped with the first conductivity type. The contact regions 14 may be disposed so as to extend along a third direction which intersects the second direction along which the trenches 20 extend. For example, the third direction may be perpendicular to the second direction. Further, the contact regions 14 may extend in stripes or portions of stripes along the third direction. For example, the contact regions 14 may extend between neighboring trenches 20. As is readily to be understood, the contact regions 14 do not need to extend between adjacent trenches 20 but may be disposed in an arbitrary manner. The source region 16b may be electrically coupled to a source metal layer 55. Further, the gate electrodes 54 may be electrically coupled with a gate metal layer 56 (shown in FIG. 2C). Due to the presence of the contact regions 14, the second conductivity type doped portions adjacent to the sidewall of the trenches 51 are electrically coupled to the body region 60. Further, portions of the body region 60 adjoin the drift zone 59. Accordingly, when being switched on, an inversion layer is formed at the boundary between the channel region 15 and the gate insulating material 53. Accordingly, the transistor is in a conducting state from the source region 16b to the drain region 75 via the drift zone 59. In case of switching-off, in the superjunction semiconductor device, charge compensated areas with carriers of the drift zone 59 and carriers of the doped portion 51 adjacent to the lower portion of the sidewall of the trenches 20 are depleted. This allows for an improved trade off between a high breakdown voltage and a low on resistance $R_{ON}$. Due to the arrangement of the gate electrode 54 in the upper portion of the trenches 20, the cell area of the device can be reduced, resulting in an increased packaging density.

According to an embodiment, a superjunction semiconductor device 61 includes a charge compensation zone. The superjunction semiconductor device 61 comprises a semiconductor substrate 10 including a first surface 11, e.g. front surface, and a second surface 12, e.g. a back surface, a source region 16b adjacent to the first surface 11, a drain region 75 adjacent to the second surface 12, trenches 20 in the first surface 11 of the semiconductor substrate 10, and a doped portion 51 adjacent to a lower portion of the trenches 20. The doped portion 51 and a part of the drift zone 59 adjoining the doped portion 51 form a charge compensation zone. A drift zone 59 is formed between the source region 16b and the drain region 75, and a gate electrode 54 is disposed in the trenches 20 adjacent to the channel 15 area.

Figure 2B:
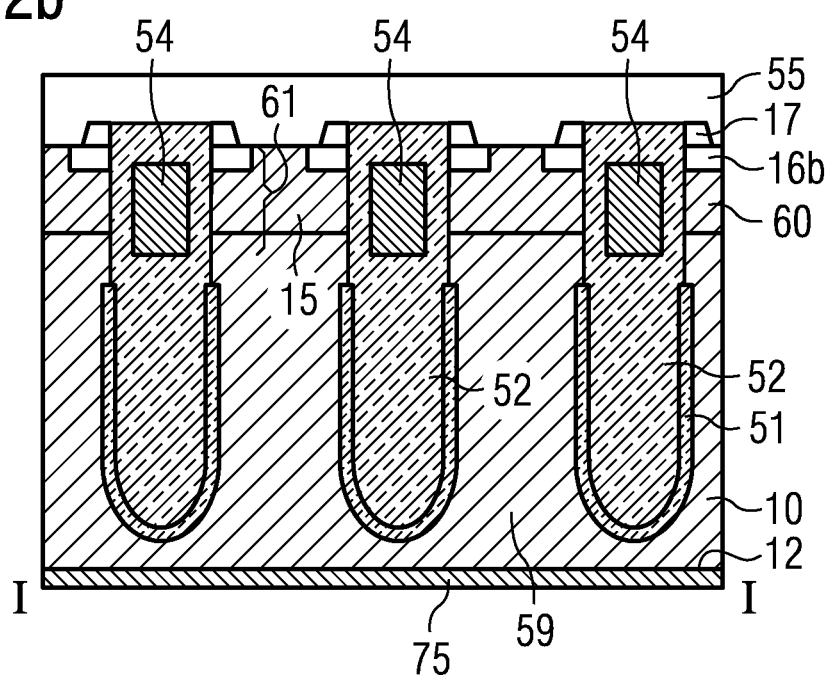

FIGS. 2a to 2d show various views of the vertical semiconductor device shown in FIG. 1. FIG. 2a shows a top view on the vertical semiconductor device. On a portion of a substrate, a source metal layer 55 and a gate metal layer 56 are disposed. The source metal layer 55 and the gate metal layer 56 are insulated by an insulating material 23. FIG. 2b shows a cross-sectional view of the vertical semiconductor device which is taken between I and I. In the region shown in FIG. 2b, the source metal layer 55 is electrically coupled to the source regions 16b and the body region 60. A transistor 61 is formed to comprise the source region 16b, a channel formed in the channel region 15 and the upper portion of the drift zone 59. A current controlled by the gate electrode 54 flows to the drain region 75 which is disposed at a back side of the substrate 10. The doped portions 51 of the second conductivity type adjacent to the sidewall of the trenches 20 are disposed at a distance from the bottom side of the doped body region 60. The drift zone 59 and the channel region 15 are disposed between the source region 16b and the drain region 75. The gate electrode 54 is disposed in the trenches 20 adjacent to the channel.

Figure 2C:
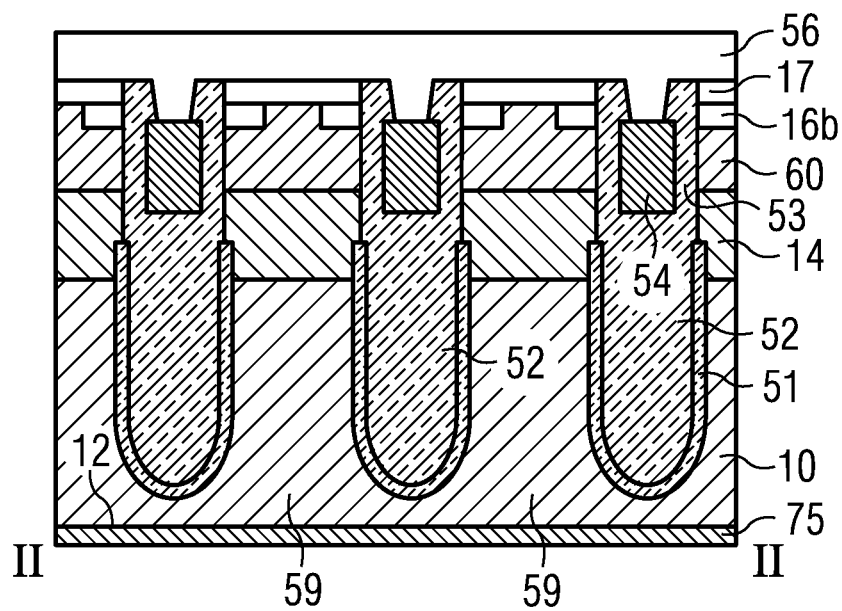

FIG. 2c shows a cross-sectional view which is taken between II and II. In this cross-sectional view the gate electrode metal layer 56 is electrically coupled to the gate electrodes 54. Further, the doped portions 51 are electrically coupled via the contact region 14 to portions of the body region 60. Accordingly, in a case of switching off the transistor, carriers in the drift zone 59 may be depleted. In the embodiment illustrated in FIG. 2, the source metal layer 55 is disposed in a region between I and I. Further, the gate metal layer 56 is disposed between II and II, i.e. in a portion, in which the contact region 14 is disposed. As is to be clearly understood, the position of the gate metal layer 56 and the source metal layer 55 is arbitrary and can be changed.

Figure 2D:
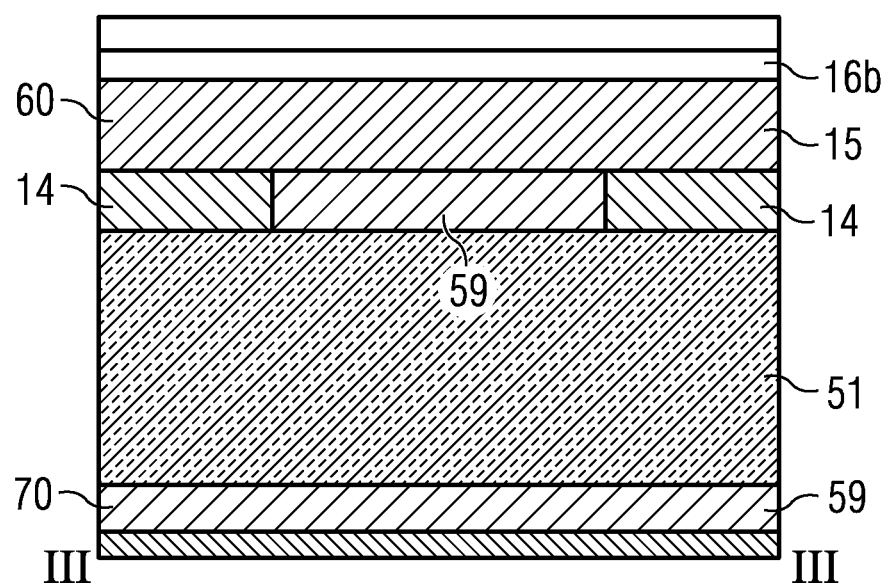

FIG. 2d shows a cross-sectional view which is taken between III and III. The lower part of this view shows the doped portion 51 that is shown in FIGS. 2b and 2c. A region of the doped portion 51 is electrically coupled to contact regions 14, the contact regions 14 being electrically coupled to the body region 60. As an example, an upper part of the contact regions 14 may overlap the body region 60 and a lower part of the contact regions 14 may overlap the doped portion 51. Moreover, in a cross-sectional view before and behind the drawing plane of FIG. 2d, portions of the body region 60 adjoin the drift zone 59 allowing current flow from the channel region 15 into the drift zone 59. As is specifically shown, in a portion above the doped portion 51 the contact regions 14 are disposed alternating with portions of the drift zone 59.

An example of a method of manufacturing such a semiconductor device will be illustrated with reference to FIGS. 3 to 14. In the following Figures, various processing steps will be illustrated. As is to be readily understood, these processing steps are only given as examples. In particular, these processing steps can be replaced by other processes which result in the same or similar structures. For example, implantation steps are given as examples for doping substrate portions. As is generally known, also alternative methods may be employed, for example, alternative doping methods or also methods such as epitaxially growing a correspondingly doped layer over the substrate.

An example of a starting material is a semiconductor substrate 10 having a homogenous doping. Optionally, on a back side of a semiconductor substrate 10, a base doping portion 13 may be formed. For example, the semiconductor substrate 10 may be n-doped, and the base doping portion 13 may have a higher doping concentration of n-type dopants. As is to be clearly understood, the base doping portion 13 can be formed at an arbitrary processing stage. For the sake of convenience, the base doping portion will not further be illustrated in the subsequent drawings. Using a stripe mask having openings extending in a third direction (X direction), a region may be defined in which a deep p implant is performed to form a contact region 14. The depth and the concentration of the contact region 14 depends on the further characteristics of the semiconductor device.

Figure 3A:
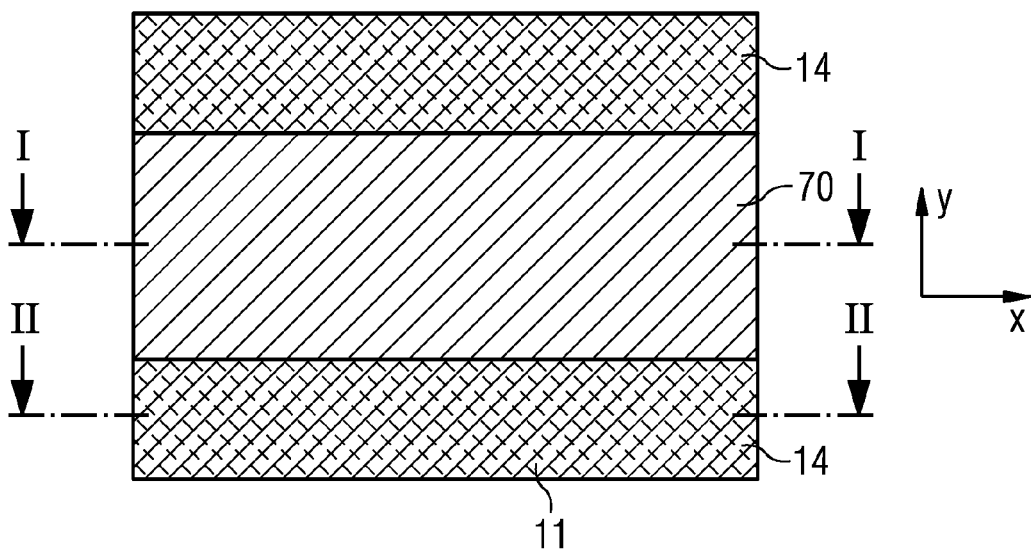
Figure 3B:
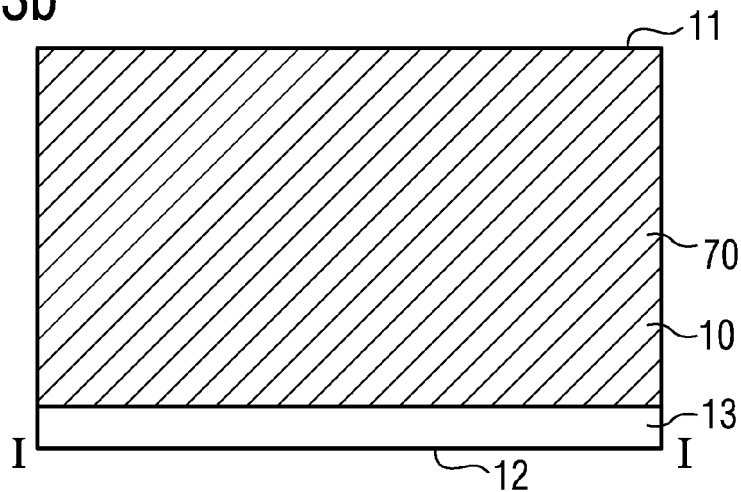

FIG. 3a shows a plan view of the resulting substrate. As is shown, the contact regions 14 extend in the X direction, alternating with regions (n doped regions) in which no deep p implantation step has been performed. FIG. 3b shows a cross-sectional view of the substrate between I and I, in which no contact region 14 has been formed.

Figure 3C:
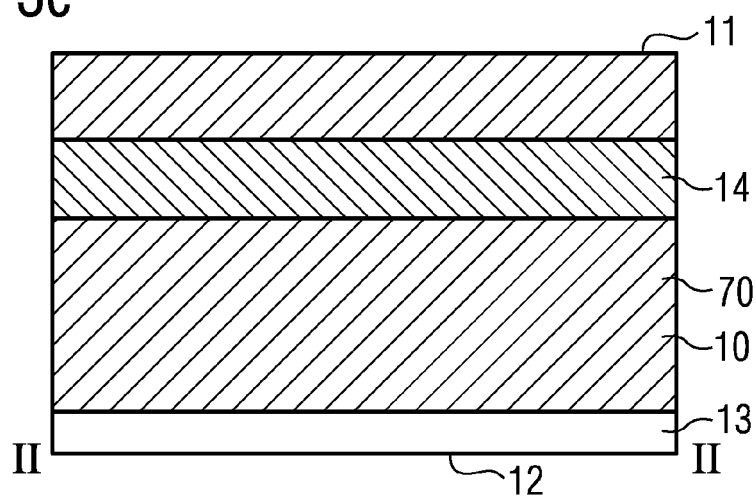

FIG. 3c shows a cross-sectional view between II and II, in which the contact region 14 has been formed.

Figure 4A:
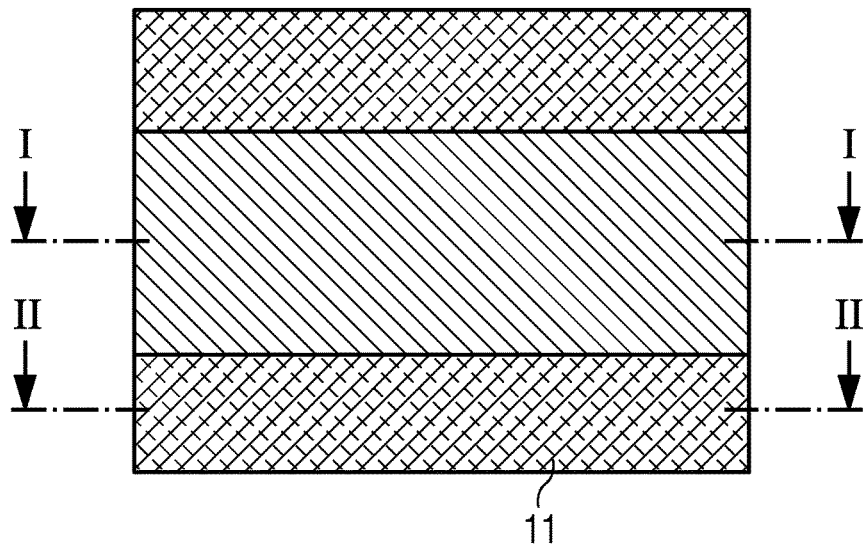
Figure 4B:
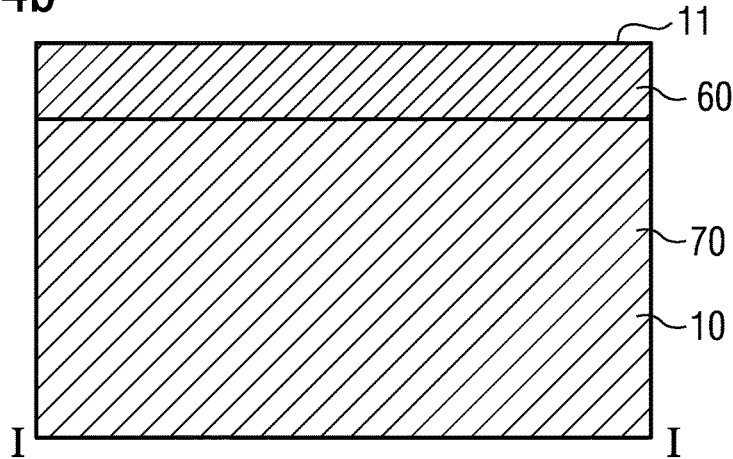
Figure 4C:
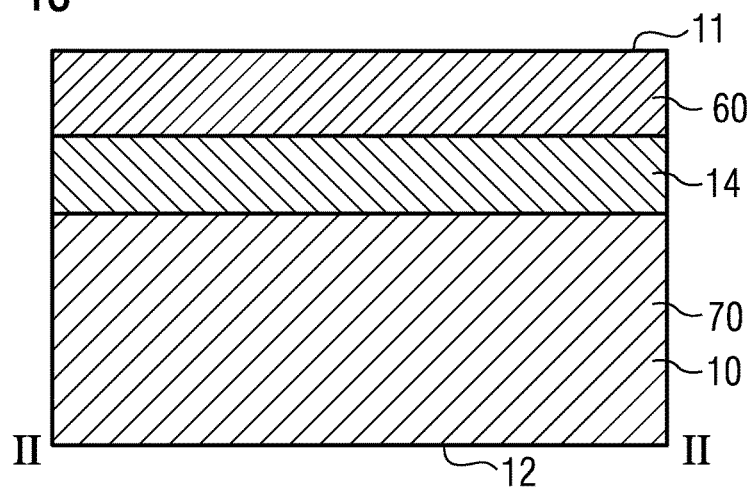

Thereafter, a shallow p implantation step is performed so as to form a body region 60 that is adjacent to a first surface 11 of the semiconductor substrate 10. FIG. 4a shows a plan view of the resulting structure. A body region 60 is formed adjacent to the substrate surface 11 over the whole area of the semiconductor device. FIG. 4b shows a cross-sectional view between I and I. The shallow p implanted body region 60 is formed so as to be in contact with the n-doped semiconductor substrate portion that defines a first region 70 of the semiconductor substrate 10. FIG. 4c shows that between II and II, contact region 14 is formed between the body region 60 and the n-doped first region 70 of the semiconductor substrate 10. The special sequence of processes given above results in a structure in which, as is also shown in FIG. 2d, contact regions 14 and n doped first regions 70 are arranged in alternating order. Any arbitrary sequence of methods by patterning and doping corresponding areas may be employed, comprising e.g. doping and counter-doping of respective substrate portions, in order to generate a corresponding pattern.

Figure 5A:
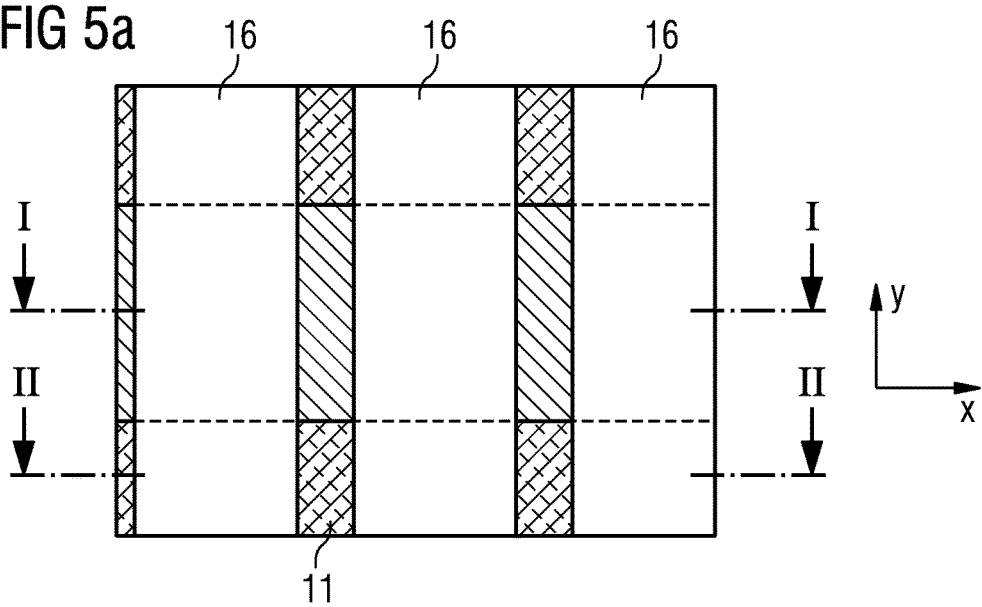

Thereafter, a further stripe mask is used for forming source implantation regions. The mask used for defining the source implantation regions 16 extends in a second direction (Y-direction) parallel to the first surface 11 of the semiconductor substrate 10. The n-doped regions are formed by doping as is commonly used for power devices. FIG. 5a shows a plan view of the resulting structure. As is shown, the source implanted regions 16 are formed so as to extend in a second direction, and the contact regions 14 extend in a third direction (X-direction) which is perpendicular to the second direction.

Figure 5B:
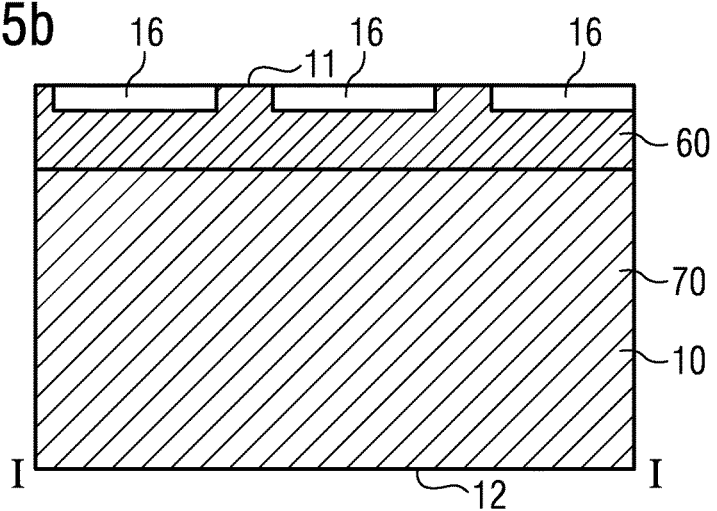
Figure 5C:
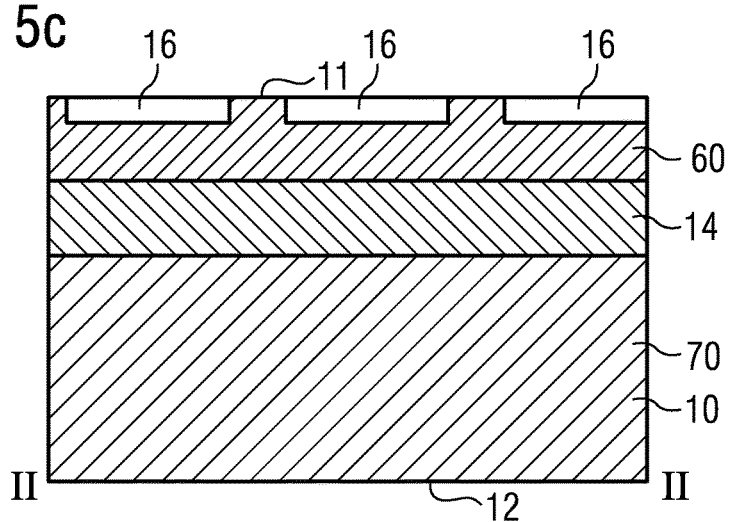

FIG. 5b shows a cross-sectional view between I and I. As can be seen, the n source implanted regions 16 are formed adjacent to a first surface 11 of the semiconductor substrate. FIG. 5c shows a cross-sectional view between II and II as indicated in FIG. 5a.

In a next step, a silicon nitride layer 17 having the function of a pad nitride layer is formed over the substrate surface 11. Thereafter, trenches 20 are formed in the semiconductor substrate 10. The trenches extend in a first direction having a component perpendicular to the first surface of the semiconductor substrate, thus extending in depth direction. For example, the trenches may be perpendicular to the substrate surface 11. Further, the trenches 20 may be formed so as to extend in the second direction. The depth of the trenches depends on the breakdown voltage that is to be achieved. As a rough measure, a depth of approximately 8 μm is chosen for achieving a breakdown voltage of 100 V. Accordingly, typically a depth of the trenches of 40 to 50 μm may be used for devices having a breakdown voltage of approximately 600 V. The trenches 20 are formed so as to have a bottom side which is disposed below a bottom side of the contact region 14. A pitch between adjacent trenches may be approximately 0.5 to 20 μm. The width of the trenches is chosen so as to achieve this pitch. It has to be appreciated that the smaller the width of each of the trenches 20, the broader the drift zone between the trenches 20 is which further decreases the resistance $R_{on}$ of the device. In particular, due to the increased width of the drift zone the doping concentration per area decreases whereby the carrier mobility increases and the resistance is further reduced. The trenches may be formed by etching as is conventional.

Figure 6A:
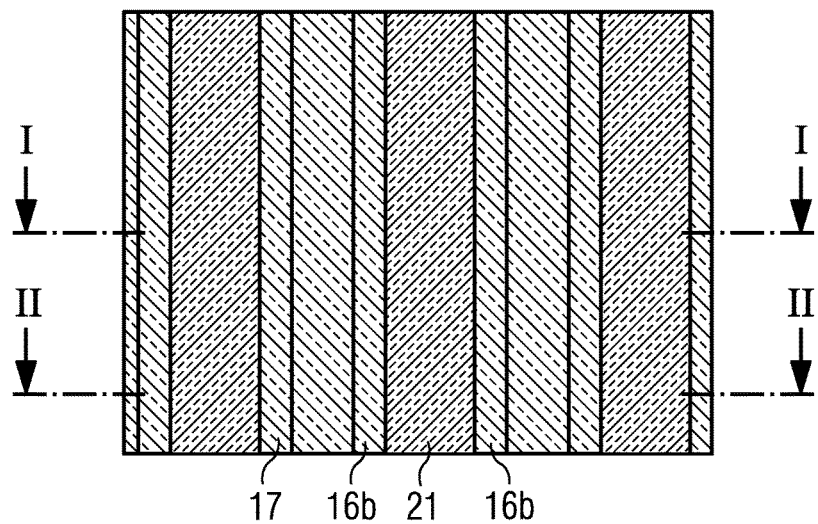
Figure 6B:
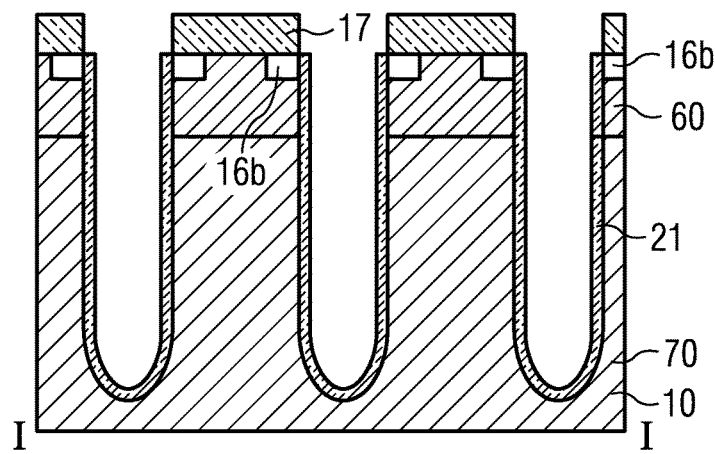
Figure 6C:
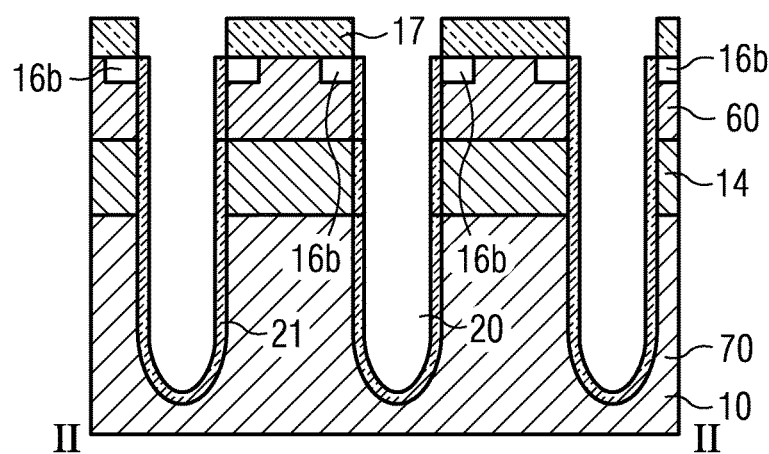

FIG. 6a shows a plan view of the resulting structure. FIG. 6b shows a cross-sectional view between I and I, and FIG. 6c shows a cross-sectional view between II and II. Due to the formation of the trenches 20, the n source implanted regions 16 have been isolated to form source regions 16b. An oxidation step is performed so as to form a silicon oxide layer 21 on a sidewall of the trench. For example, this oxidation may be accomplished by a furnace process such as, for example, an ISSG (in-situ steam generation) or a so-called Radox method. Thereafter, a polysilicon material 22 may be filled in the trenches. For example, this may be accomplished by a LPCVD (low pressure chemical vapor deposition) method. After forming the polysilicon filling, a recessing step is performed so as to adjust the height of the polysilicon filling 22. For example, this step may be performed so that a first surface of the polysilicon filling 22 is disposed between the surfaces of the contact region 14.

FIG. 7a shows a cross-sectional view that is taken between I and I, and FIG. 7b shows a cross-sectional view which is taken between II and II. As can be seen, the first surface of the polysilicon filling 22 is disposed beneath the lower surface of the body region 60 and above the first surface of the n-doped substrate region 70.

Then, an oxide spacer 23 is deposited on the surface of the silicon oxide layer 21. For example, the spacer may be formed by an LPCVD method using TEOS as a starting material. Thereafter, an etching step is performed so as to remove the silicon oxide layer 21 only above the polysilicon material 22 in the trenches 20, whereas, according to an embodiment, the horizontal portions of the silicon oxide layer 21 over the first surface 11 of the semiconductor substrate are not removed. Further, the vertical portions of the oxide spacer 23 are not removed.

Figure 8A:
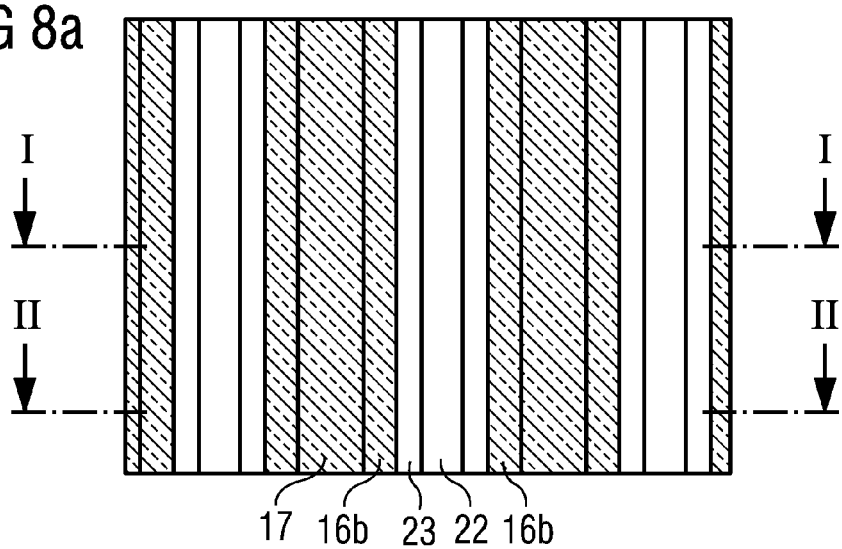
Figure 8B:
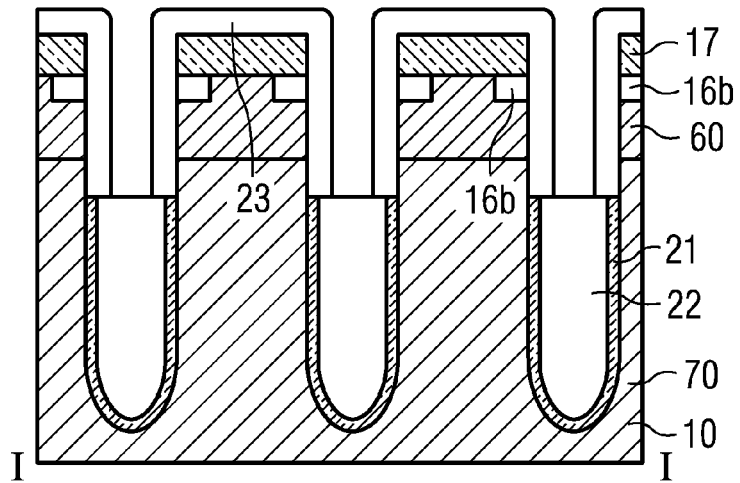
Figure 8C:
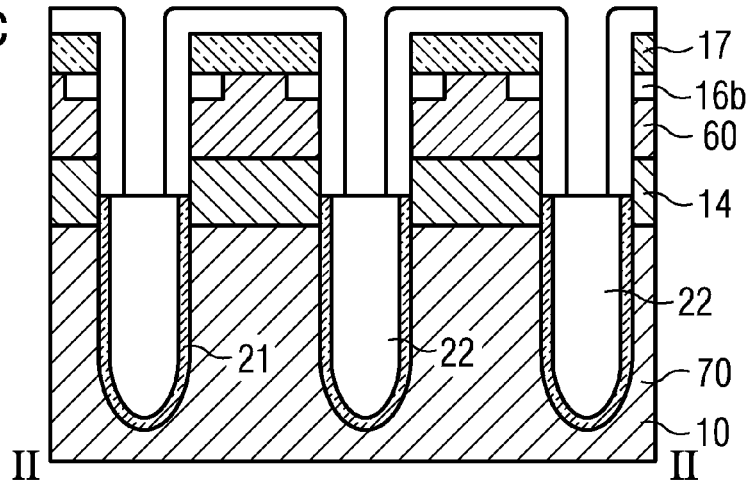

FIG. 8 shows various views of the resulting structure. FIG. 8a shows a plan view of the substrate 10. As can be seen, the trenches 20 extend as stripes in a first direction of the substrate 10. FIG. 8b shows a cross-sectional view between I and I, and FIG. 8c shows a cross-sectional view between II and II. The silicon oxide spacer 23 is disposed at an upper sidewall of the trenches 20. The polysilicon filling 22 is disposed in a lower portion of the trenches 22.

Thereafter, the polysilicon filling 22 is removed from the trenches 20. For example, this may be accomplished by a conventional wet chemical or dry etching step. A further etching step may be performed so as to thin the silicon oxide layer 21. Then, doping is performed to form the sidewall doped portion 51. For example, boron may be used as a dopant. This may be accomplished by depositing a doped material such as, for example, a layer that contains boron. Then, a thermal step may be performed so as to provide the p-doped sidewall layer 51.

Figure 9A:
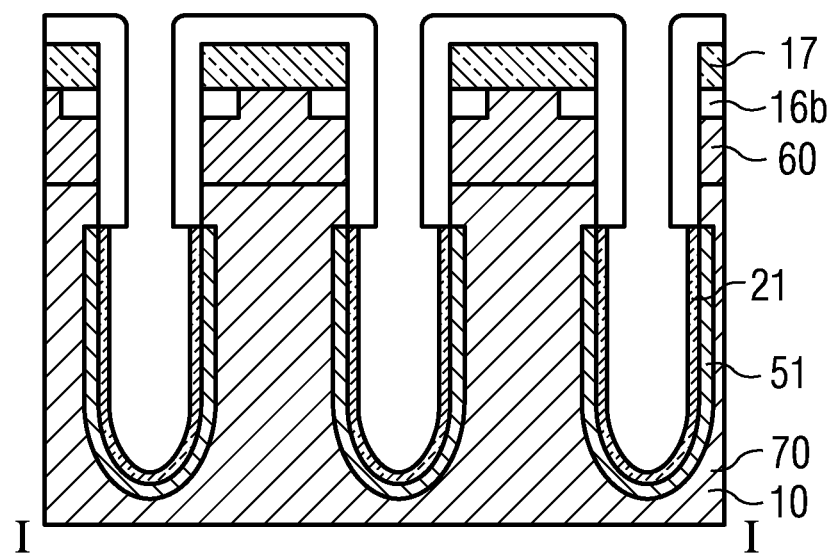
Figure 9B:
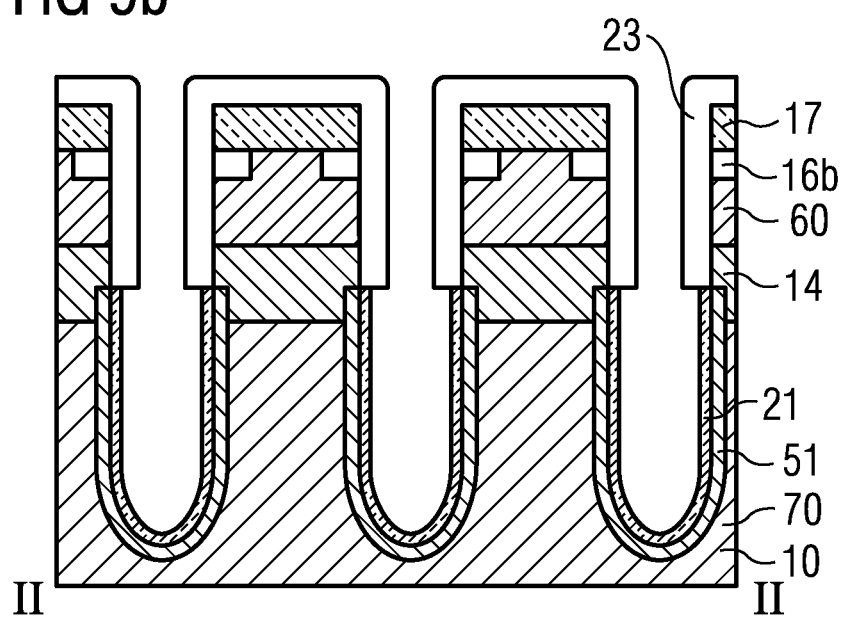

FIGS. 9a and 9b show cross-sectional views of the resulting structure. As can be seen, the sidewall doped portion 51 is formed at the portion of the trenches 20 in which the polysilicon filling 22 was present before. Accordingly, an upper portion of the sidewall doping portion 51 extends to the contact region 14 and does not reach the layer 15.

Thereafter, the trenches 20 are filled with an oxide material such as silicon oxide. For example, spin-on-glass may be filled in the trenches 20 by a conventional process. Thereafter, the oxide layer 21 is etched back so that a first surface of the oxide filling 52 inside the trenches 20 is disposed above the lower side of the doped sidewall portion 51 and below the first surface of the contact region 14.

Figure 10A:
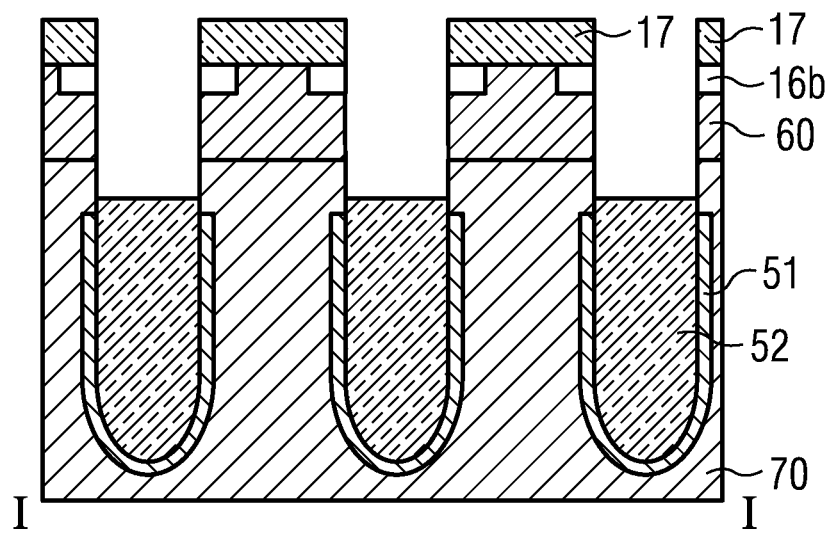
Figure 10B:
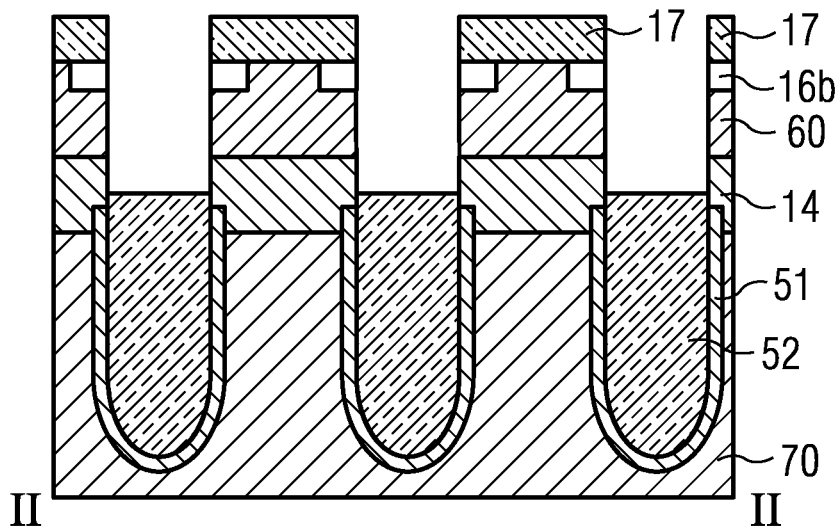
Figure 11A:
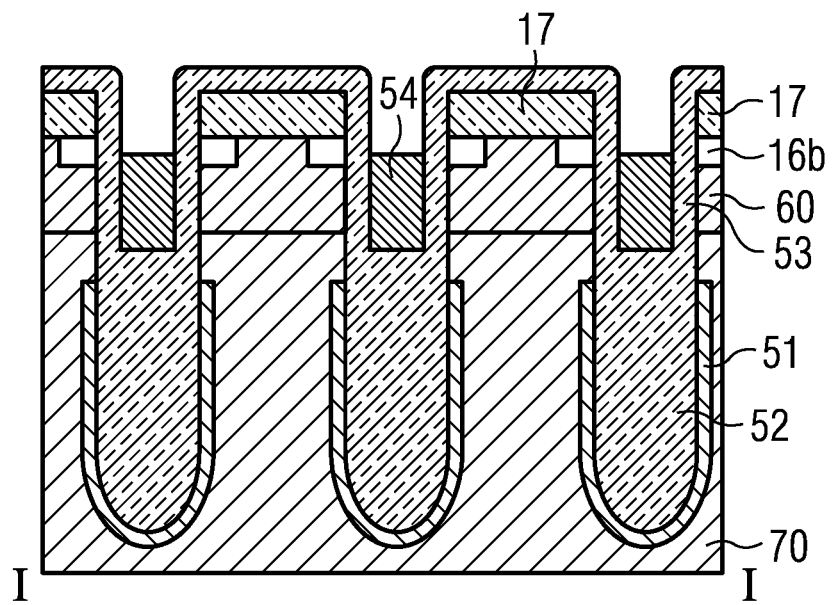
Figure 11B:
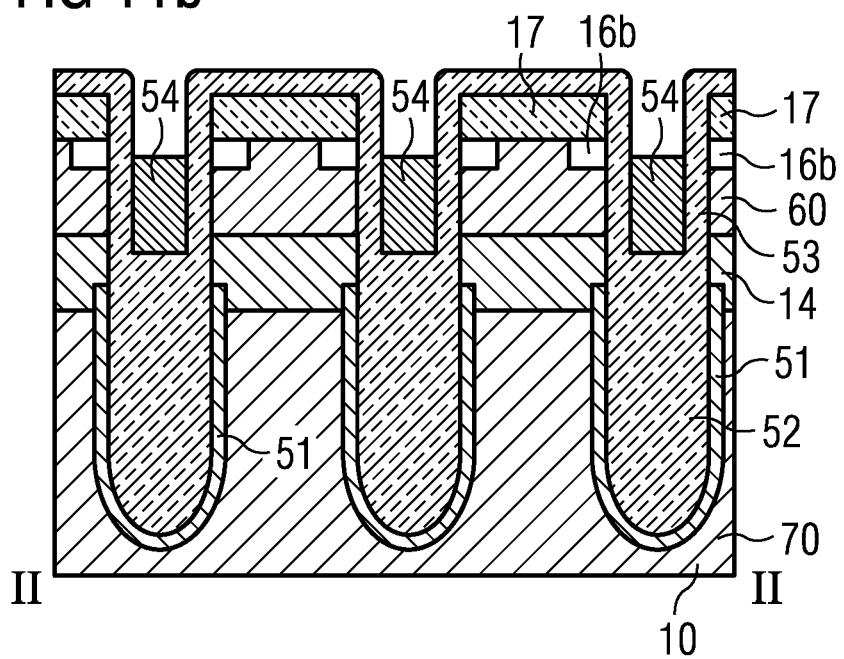

FIG. 10 shows cross-sectional views of examples of the resulting structures. FIG. 10a shows a cross-sectional view between I and I, and FIG. 10b shows a cross-sectional view between II and II. As can be seen, a first surface of the oxide filling 52 is disposed below the lower side of the body region 60 and below a first surface of the p-implanted contact region 14. Thereafter, the gate electrode will be formed in the trenches 20. First, a gate oxide 53 is disposed at the sidewalls of the trenches 20. For example, this may be accomplished by pre-oxidation step, followed by a TEOS process (tetraethyl orthosilicate). The gate oxide layer 53 may have a thickness of about 50 to 80 nm when gate voltages of 10 to 20 V are to be applied. Then, polysilicon material 54 is filled in the trenches 20 as is conventional. Thereafter, a poly recess etching step is performed as is conventional. FIGS. 11a and 11b show cross-sectional views of the resulting structure. FIG. 11a shows a cross-sectional view between I and I, and FIG. 11b shows a cross-sectional view between II and II. The lower side of the gate electrode 54 extends below a lower surface of the body region 60. A first surface of the gate electrode 54 is disposed above a lower surface of the source regions 16b.

Thereafter, contact holes to the source regions 16b and to the gate electrode 54 will be formed. In a first step, a silicon oxide layer is deposited so as to cover the upper portion of the gate electrode 54. Then, a planarization step is performed so as to remove an upper horizontal portion of the silicon oxide layer. As a result, remaining portions of the silicon nitride layer are uncovered. Then, source contact openings 24 are defined so as to open the silicon nitride layer in a portion in the area in which the source region is to be formed. Moreover, gate contact openings 25 are formed to contact the gate electrode 54.

Figure 12A:
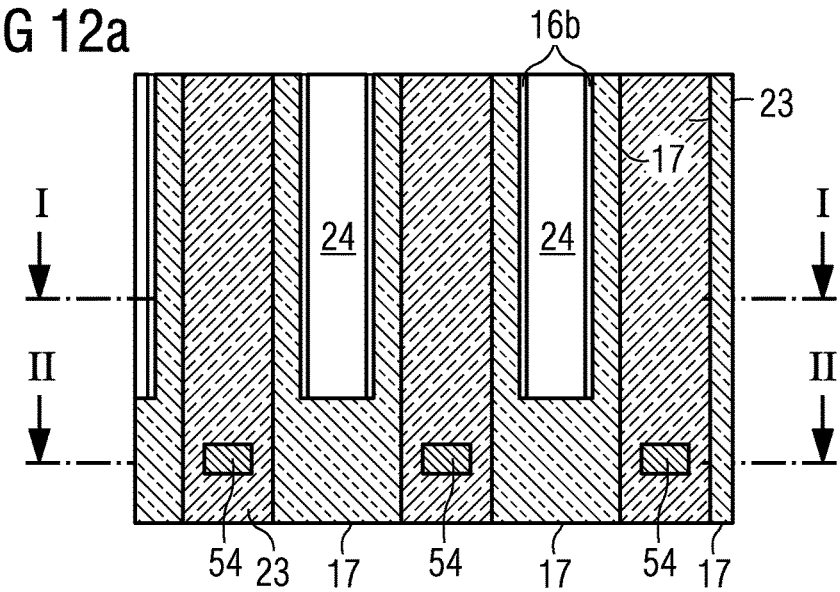
Figure 12B:
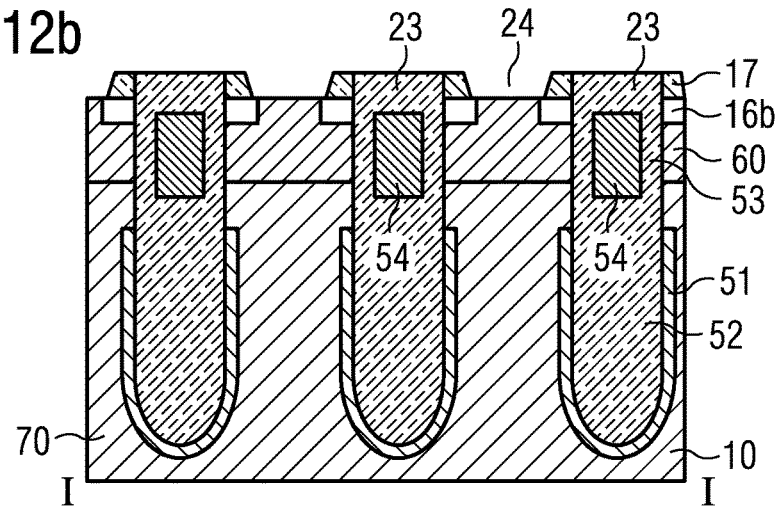
Figure 12C:
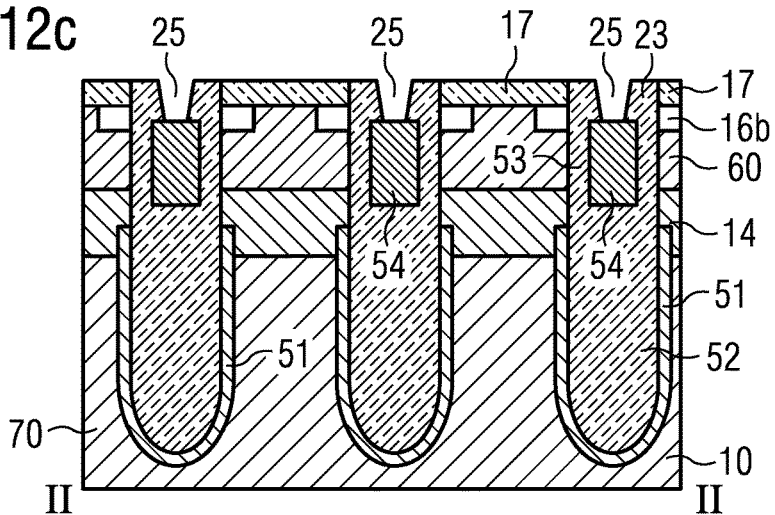

FIG. 12a shows a plan view of the resulting structure between I and I. As can be seen, in the area, in which the cross-sectional view between I and I is taken, portions of the source regions 16b are uncovered. FIG. 12b shows a cross-sectional view between II and II. In the areas in which the cross-sectional view between II and II is taken, the gate electrode 54 is uncovered so that a gate contact opening 25 is formed in the oxide layer 23.

Thereafter, a metal layer is deposited. Suitable metals comprise metals which are commonly used such as aluminum, copper, tungsten and others. Further, the metal layer may be patterned by known methods such as wet or dry etching.

Figure 13A:
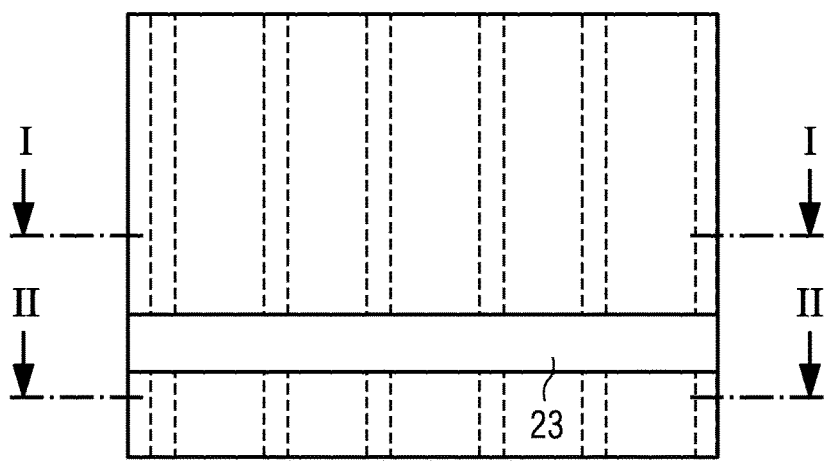
Figure 13B:
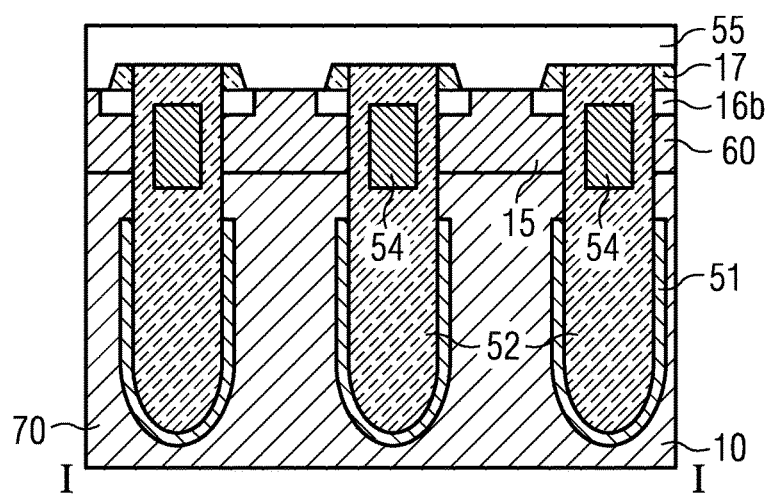
Figure 13C:
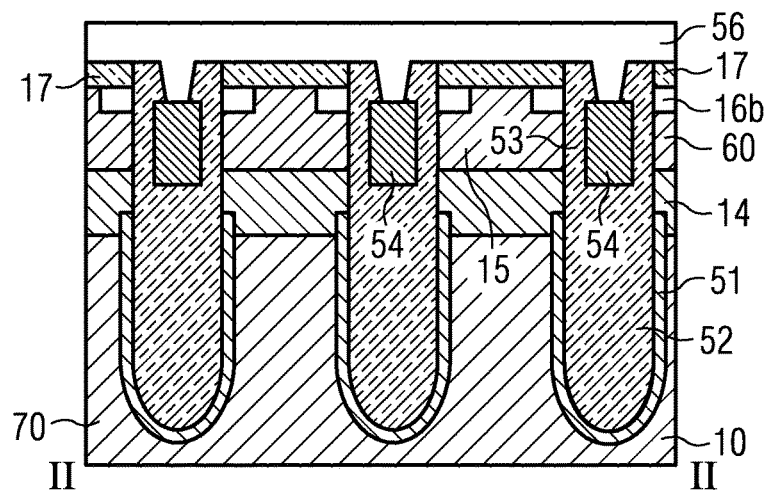

FIG. 13 shows views of examples of the resulting structure. As can be seen from FIG. 13a which shows a plan view, the area in which the source metal is present is insulated from the area which the gate metal is present, by an insulating material 23. Further, FIG. 13b shows a cross-sectional view between I and I. As can be seen, the source metal 55 is in contact with the source regions 16b. Moreover, FIG. 13c shows a cross-sectional view between II and II. The gate metal 56 is in contact with the gate electrodes 54.

The semiconductor device may be further processed in a manner as is conventional. In particular, a metal deposition process, as is generally known, may be performed in order to form the electrode electrically coupled to the drain region 75, the electrode being disposed on the back side of the substrate.

As has been shown above, the integrated circuit comprising a vertical semiconductor device may be manufactured by a simple process. Due to the use of several stripemasks, the method can be further simplified resulting in a cost reduction.

FIG. 14 schematically illustrates a method of forming an integrated circuit.

As is shown, a method of manufacturing a semiconductor device comprises forming a plurality of trenches a in an first surface of a semiconductor substrate (S2), the semiconductor substrate comprising a first region of a first conductivity type and a body region of a second conductivity type, the first conductivity type being different from the second conductivity type, the trenches being formed so as to extend in a first direction having a component perpendicular to the first surface. The method further comprises forming doped portions of a second conductivity type (S3) adjacent to a lower portion of a sidewall of the trenches, electrically coupling the doped portions to the body region via contact regions (S1), and forming a gate electrode (S4) in an upper portion of the trenches. According to an embodiment, forming the contact regions (S1) may be performed before forming the trenches. For example, the contact regions may be formed by forming regions doped with the second conductivity type, wherein the contact regions are formed so as to be in contact with regions of the doped portions adjacent to a portion of a sidewall of the trenches. As is to be clearly understood, any processing sequence may be employed. For example the contact regions may as well be formed after forming the trenches, or parts of the single processes may be interleaved with each other.

While embodiments of the invention have been described above, it is obvious that further embodiments may be implemented. For example, further embodiments may comprise any subcombination of features recited in the claims or any subcombination of elements described in the examples given above. Accordingly, the spirit and scope of the appended claims should not be limited to the description of the embodiments contained herein.

What is claimed is:

1. A superjunction semiconductor device comprising a charge compensation zone, the superjunction semiconductor device further comprising:
    a semiconductor substrate comprising a first region of a first conductivity type and a body region of a second conductivity type, the first conductivity type being different from the second conductivity type, the body region being disposed on a side of a first surface of the semiconductor substrate;
    a plurality of trenches arranged in the first surface of the substrate, the trenches extending in a first direction having a component perpendicular to the first surface;
    doped portions of the second conductivity type adjacent to a lower portion of a sidewall of the plurality of trenches, the doped portions being electrically connected to the body region via contact regions of the second conductivity type, the contact regions being electrically coupled to the body region; and
    regions of the doped portions adjacent to a portion of a sidewall of the trenches being electrically coupled to the contact regions;
    wherein the plurality of trenches further extend in a second direction parallel to the first surface and the contact regions extend in a third direction parallel to the first surface of the substrate, the third direction intersecting the second direction;
    a drift zone of the first conductivity type in direct contact with the doped portions of adjacent first and second trenches of the plurality of trenches, the drift zone being arranged between the first and second trenches, the charge compensation zone comprising the drift zone and the doped portions, the drift zone of the first conductivity type continuously extending from one of the doped portions at a sidewall of the first trench to another one of the doped portions at a sidewall of the second trench; and
    a gate electrode disposed in an upper portion of the plurality of trenches.

2. The semiconductor device of claim 1, wherein the doped portions of the second conductivity type line the sidewall and a bottom side of each of the plurality of trenches.

3. The semiconductor device of claim 1, wherein the semiconductor device is a vertical superjunction device including a charge compensation zone formed of the doped portions at opposing sidewalls of the adjacent first and second trenches and a part of a drift zone therebetween.

4. The semiconductor device of claim 1, wherein a portion of the plurality of trenches below the gate electrode is filled with an insulating material.

5. The semiconductor device of claim 1, wherein a channel region is disposed adjacent to the gate electrode, the channel region being electrically insulated from the gate electrode.

6. The semiconductor device of claim 1, wherein the plurality of trenches further extend in a second direction parallel to the first surface of the semiconductor substrate.

7. The semiconductor device of claim 1, wherein a channel region is disposed in the body region and adjoins the first region of the first conductivity type.

8. The semiconductor device of claim 1, wherein a lower side of the gate electrode is disposed over an upper side of the doped portions of the second conductivity type adjacent to the lower portion of the sidewall of the plurality of trenches.

9. An integrated circuit comprising the semiconductor device of claim 1.

10. The semiconductor device of claim 1, wherein the contact regions are semiconductor regions buried in the semiconductor substrate and arranged between the body region and the doped regions.

11. The semiconductor device of claim 10, wherein a lower part of the contact regions overlap the doped portions.

* * * * *